United States Patent [19]
Abe

[11] Patent Number: 5,737,711
[45] Date of Patent: Apr. 7, 1998

[54] DIAGNOSIS SYSTEM FOR MOTOR VEHICLE

[75] Inventor: Kunihiro Abe, Higashi-Murayama, Japan

[73] Assignee: Fuji Jukogyo Kabuishiki Kaisha, Tokyo, Japan

[21] Appl. No.: 550,237

[22] Filed: Oct. 30, 1995

[30] Foreign Application Priority Data

Nov. 9, 1994 [JP] Japan .................................. 6-275349
Nov. 9, 1994 [JP] Japan .................................. 6-275350

[51] Int. Cl.$^6$ .......................... G06F 13/00; G06F 17/40; G01R 31/00
[52] U.S. Cl. ................................ 701/29; 701/33; 701/35; 701/551.01; 395/500; 395/680; 340/438; 340/439
[58] Field of Search .................. 364/424.034, 424.035, 364/424.037, 424.038, 424.039, 424.04, 551.01, 580; 371/22.2; 340/438, 439; 324/73.1; 73/116, 117.2, 117.3; 395/500, 680, 682

[56] References Cited

U.S. PATENT DOCUMENTS

| | | |
|---|---|---|
| 4,831,560 | 5/1989 | Zaleski .......................... 364/551.01 |
| 4,967,143 | 10/1990 | Raviglione et al. ................ 324/73.1 |
| 5,056,023 | 10/1991 | Abe ............................... 364/424.037 |
| 5,107,428 | 4/1992 | Bethencourt et al. ............. 364/424.04 |
| 5,278,759 | 1/1994 | Berra et al. ..................... 364/423.098 |
| 5,491,418 | 2/1996 | Alfard et al. ..................... 324/402 |
| 5,541,840 | 7/1996 | Gurne et al. .................... 364/424.038 |
| 5,555,498 | 9/1996 | Berra et al. ..................... 364/424.038 |

*Primary Examiner*—Tan Q. Nguyen
*Attorney, Agent, or Firm*—Beveridge, Degrandi, Weilacher & Young, LLP

[57] ABSTRACT

A diagnosis system conducts diagnosis with data read out of an electronic control unit with a communications protocol installed in a vehicle. The system has an integrated circuit to be an communications interface suitable for the protocol. The circuit can be made suitable for any communications protocol by reprogramming logical functions of the circuit with design information. Instead of such circuit, the system may have a main processor and a subprocessor. On one hand, the main processor conducts virtual data communication with the control unit for diagnosis. On the other hand, the subprocessor executes a communications processing program suitable for the protocol to have data communication with the control unit. The subprocessor receives data from the main processor and transfers the data to the control unit and vice versa for the virtual data communication.

8 Claims, 6 Drawing Sheets

DIAGNOSIS SYSTEM FOR MOTOR VEHICLE

BACKGROUND OF THE INVENTION

The present invention relates to a diagnosis system for a vehicle with data read out of an electronic control unit installed in the vehicle. Particularly, this invention relates to a diagnosis system applicable to several kinds of protocols for data communication.

Recently, an electronic control of an automobile becomes more complicated. What is essential for diagnosing such vehicles is the diagnosis system that can easily read out data of electronic control units installed in the vehicles.

This diagnosis system is mainly designed for portability and general purposes. A car mechanic thus can easily check the control system of the automobile. Most diagnosis systems are equipped with a memory cartridge detachable to the system. The memory cartridge contains a recording medium that stores diagnosis programs corresponding to kinds, types of automobiles manufactured in specific years, etc. The diagnosis system with the memory cartridge makes data communication with the electronic control unit in the automobile with the data read therefrom. Such a system, or diagnosis equipment is disclosed by Japanese Patent Laid-Open No. 1-210844.

There are many kinds of electronic control units installed in automobiles. These units employ different kinds of communications systems and interfaces. Car manufacturers provide different communications protocols for various kinds of automobiles. These situations force repair shops to prepare any diagnosis equipment with hardware applicable to different communications protocols for each car manufacturer or type of an electronic control unit. Preparing the equipment for each communications protocol is economically very hard for the repair shops.

To solve such a problem, Japanese Patent Laid-Open No. 3-111733 discloses signal converting adapters detachable to a data processing circuit in diagnosis equipment. This makes exchangeable a circuit portion of the diagnosis equipment for data communication with a control system of an automobile. The diagnosis equipment is thus made applicable to several kinds of communications protocols.

However, one kind of diagnosis equipment requires several additional hardware. This results in a higher total production cost. Further, this causes mis-diagnosis at a repair shop due to erroneous attachment of additional hardware for data communication to the diagnosis equipment. Such erroneous attachment often occurs when exchanging diagnosis programs for different kinds of automobiles, types of automobiles manufactured in specific years, etc.

SUMMARY OF THE INVENTION

An object of the present invention is to provide a diagnosis system suitable for any electronic control units with different communications protocols installed in vehicles without changing hardware.

According to the present invention, there is provided a diagnosis system for a motor vehicle, having various sensors for detecting operating conditions of the vehicle and for generating vehicle operating signals, an electronic control unit responsive to the vehicle operating signals for controlling the vehicle and for producing control signals, various actuators and indication lamps responsive to the control signals for operating the vehicle in an optimum condition corresponding to each of the operating conditions, the system reading out data in the electronic control unit and for transmitting the data and further having diagnosing means responsive to the control signals for diagnosing the electronic control unit by comparing the transmitted data with normal data stored in a memory, and a memory cartridge detachable to the diagnosing means, for storing various diagnosis programs and communications protocols, the diagnosis system comprising: an interface circuit provided in the memory cartridge and directly connected to the electronic control unit for matching a logic function corresponding to each control signal and for generating a communications signal; memory means for storing various kinds of logic programs; and an in-system programmer responsive to the communications signal for controlling the memory means by reprogramming logical functions of the circuit with design information so as to precisely diagnose the vehicle at a high speed without changing the memory cartridge for various types of the electronic unit.

The diagnosis system may further include a storage for storing various kinds of design information for reprogramming. The storage may be a volatile storage or an electronically erasable nonvolatile storage.

The diagnosis system may further include a recording medium, provided in the memory cartridge, for storing the diagnosis programs.

The diagnosis system may further include an interface circuit provided in the cartridge for connecting the integrated circuit to the electronic control unit.

Further, according to the present invention, there is provided a diagnosis system for conducting diagnosis with data read out of an electronic control unit with a communications protocol installed in a vehicle, comprising: a main processor for conducting virtual data communication with the electronic control unit for diagnosis; and a subprocessor for executing a communications processing program suitable for the communications protocol to have data communication with the electronic control unit, wherein the subprocessor receives first data from the main processor and transfers the first data to the electronic control unit, and receives second data from the electronic control unit and transfers the second data to the main processor for the virtual data communication.

The diagnosis system may further include a memory cartridge detachable to the diagnosis system; and a recording medium for storing the communications processing program. The recording medium may store a diagnosis program executed by the main processor.

In the system, addresses of the communications processing program and the diagnosis program may be allocated in a storage area of the main processor, and the communications processing program is transferred to the subprocessor before the communications processing program is executed by the subprocessor.

The diagnosis system may further include an interface circuit for connecting the subprocessor to the electronic control unit.

DETAILED DESCRIPTION OF THE PREFERRED EMBODIMENTS

Preferred embodiments according to the present invention will be described with reference to the attached drawings.

Figure 1:
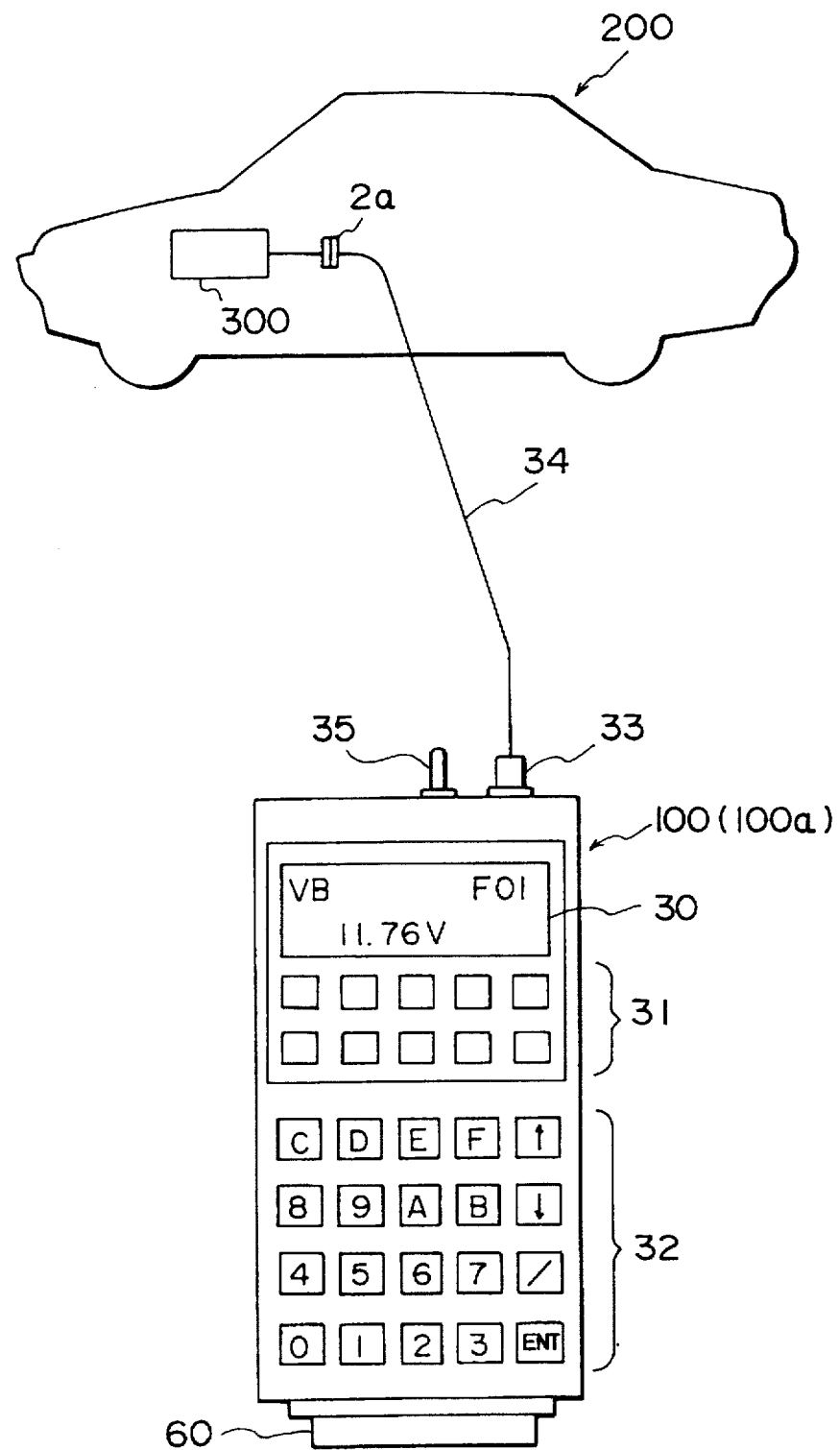
FIG. 1 shows a front view of fault diagnosis equipment connected to an electronic control unit in an automobile, according to the present invention.

FIG. 1 shows a front panel of a portable diagnosis equipment 100 according to the present invention. The diagnosis equipment 100 is connected to an electronic control unit 300 installed in an automobile 200 for diagnosis. Provided on the front panel are a liquid crystal display screen 30, an indicator 31 of light emitting diodes and a keyboard 32. An input/output connector 33 and a power switch 35 are provided on top of the diagnosis equipment 100. An adaptor harness 34 is extending from the input/output connector 33. A memory cartridge 60 is inserted in the lower part of the diagnosis equipment 100. The cartridge 60 will be described later.

To diagnose any fault occurring in the electronic control unit 300: first, connect the adaptor harness 34 to a connector 2a of the control unit 300; second, turn on the power switch 35; third, enter specific keys on the keyboard 32; and lastly, execute diagnosis while looking at displays on the display screen 30.

Figure 2:
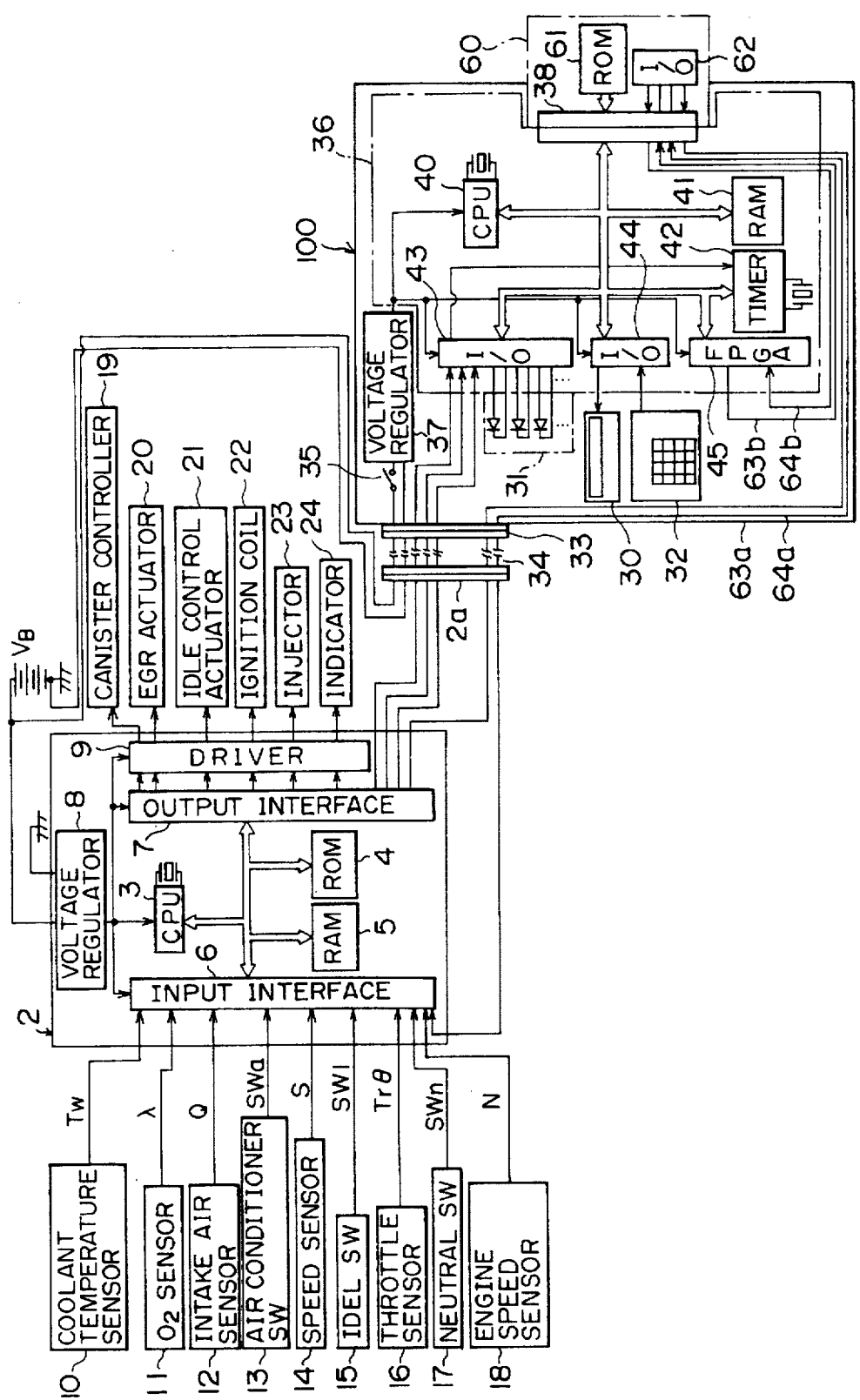
FIG. 2 shows circuit block diagrams of the electronic control unit and the diagnosis equipment as the first preferred embodiment according to the present invention.

The preferred embodiments employ an engine control unit (ECU) 2 to be diagnosed as the electronic control unit 300 as shown in FIG. 2. Besides engine control, the electronic control unit 300 may be used for: power train control of an engine, an automatic transmission, etc.; vehicle body control, such as air conditioning and several information guidance systems; vehicle control, such as suspension control and auto-cruising, etc.

As shown in FIG. 2, the engine control unit 2 is a microcomputer with a voltage regulator 8 that supplies predetermined constant voltages to the circuitry and a driver 9. The microcomputer includes: a CPU 3 as a main arithmetic unit; a ROM 4 that stores predetermined data, such as an engine control program and several memory maps; a RAM 5 that stores data obtained by processing output signals of several sensors; an input interface 6 to which these output signals are supplied; and an output interface 7 that supplies control signals to several actuators. Via buses, these components are connected to each other.

Data signals applied to the input interface 6 are: a coolant temperature signal TW produced by a coolant temperature sensor 10; a lean/rich signal λ of an air-fuel ratio produced by an oxygen sensor 11; an intake air quantity signal Q produced by an intake air sensor 12; an ON/OFF signal SWa of an air conditioner switch 13; a vehicle speed signal S produced by a speed sensor 14; an ON/OFF signal SW1 of an idle switch 15; a throttle signal Trθ produced by a throttle sensor 16, the signal Trθ representing a throttle opening degree; an ON/OFF signal SWn of a neutral switch 17; and an engine speed signal N produced by an engine speed sensor 18.

These data signals are processed by the CPU 3 and written into the RAM 5 for control quantity computations. The CPU 3 reads the data from the RAM 5 to compute several control quantities, such as a fuel injection pulse width and an ignition timing. The CPU 3 produces the control signals corresponding to the control quantities. The control signals are supplied to the driver 9 via output interface 7 at a predetermined timing.

Connected to the driver 9 are: a canister controller 19 for controlling canister purge quantity; an EGR actuator 20 for controlling EGR quantity; an idle control actuator 21 for controlling an idle rotation number; an ignition coil 22 for supplying a high voltage to an ignition coil to ignite; and an injector 23 for injecting fuel into an engine. The driver 9 drives these components with the control signals supplied thereto via output interface 7 to control the engine in each driving zone.

Also connected to the driver 9 is a self-diagnosis indicator 24 for notifying faults when discovered by self-diagnosis function. The indicator 24 has a set of lamps which are flicked by predetermined times or turned on in a predetermined manner. These light indications respond to trouble codes read out of the ROM 4 and that correspond to fault portions.

The RAM 5 has a backup RAM that is supplied with subsidiary power supply from a battery $V_B$ via voltage regulator 8 after the main power is removed. The backup RAM stores values obtained by learning, trouble codes corresponding to fault portions, etc.

The diagnosis equipment 100 is suitable for use at a repair shop in a car dealer, for instance. The diagnosis equipment 100 includes a controller 36 (microcomputer) and a voltage regulator 37. Connected to the voltage regulator 37 is the power switch 35 which is further connected to the battery $V_B$ via adapter harness 34. The detachable memory cartridge 60 with a ROM 61 is inserted into the controller 36 via connecter 38.

The controller 36 includes a CPU 40 as a main processor, a RAM 41, a timer 42 for generating a synchronizing signal, I/O interfaces 43 and 44, a communications interface (which will be described later). Via buses, these components and the ROM 61 of the memory cartridge 60 are connected to each other. The output signals of the sensors and switches of the ECU 2 are supplied to the I/O interface 43 via output interface 7. In response to the output signals, the I/O interface 43 generates signals to turn on the LEDs of the indicator 31. The LEDs indicate ON or OFF situations of the sensors and switches. A key entry on the keyboard 32 generates signals that are supplied to the I/O interface 44. The interface 44 generates signals that are supplied to the display screen 30.

The first preferred embodiment employs a Field Programmable Gate Array (FPGA) 45 as the communications interface. The FPGA 45 is of a semiconductor integrated circuit with reprogrammable logical functions. These functions can be reprogrammed on board with supply of design information applicable to a communications protocol of the ECU 2.

Figure 3:
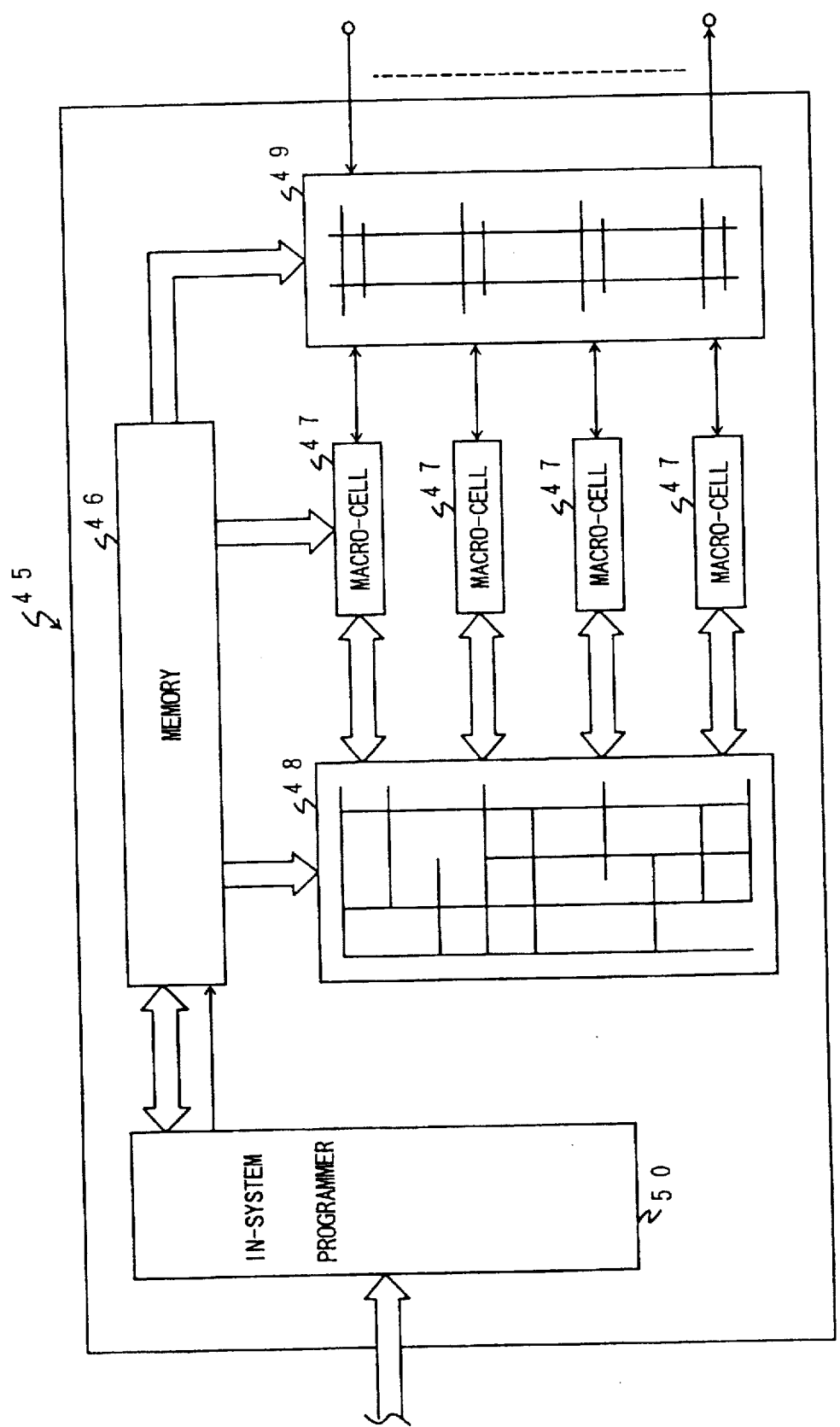
FIG. 3 shows a circuit block diagram of FPGA 45 shown in FIG. 2.

As shown in FIG. 3, the FPGA 45 includes: a memory 46 that stores programmed contents; macro-cells 47 the logical functions of which depend on the contents of the memory 46; a logical wiring block 48 that inter-connects the macro-cells 47 with data from the memory 46; an I/O wiring block 49 for making the macro-cells 47 acceptable to external input/output signals; and an in-system programmer 50 for managing the memory 46. The memory 46 is either of a SRAM type volatile memory or an EEPROM type non-volatile memory data of which is electrically erasable.

The memory cartridge 60 is to make the diagnosis equipment 100 flexible for general use, or applicable to different diagnosis items, car types, communications protocols, etc. For these purposes, the ROM 61 stores a diagnosis boot program for the CPU 40, a diagnosis program for an electronic control unit (ECU 2) of a specific automobile, and logical data for reprogramming the FPGA 45. The ROM 61 does not necessarily store the boot program. A read only memory storing the boot program may be installed in the controller 36.

The memory cartridge 60 includes an I/O interface 62 that connects the FPGA 45 and the ECU 2. Communications lines 63a and 64a are connected to the I/O interface 62 via connector 38. Further, the Communications lines 63a and 64a lines are connected to the input and output interfaces 6 and 7 of the ECU 2, respectively, via input/output connector 33 and adapter harness 34.

The I/O interface 62 is used for converting signal levels, input/output performances, etc., into ones suitable for any types of ECU 2. Engine control units may be different in communications systems of automobiles. Further, such control units cannot be compensated for with the logical functions of the FPGA 45. Connected to the I/O interface 62 via connector 38 are communications lines 63b and 64b extended from the output and input terminals of the FPGA 45, respectively. The I/O interface 62 can be replaced with wires connecting the communications lines 63a and 63b, and 64a and 64b. This replacement is possible when the signals are matched to each other between the ECU 2 and the FPGA 45.

To diagnose any faults, insert the memory cartridge 60 with the ROM 61 into the diagnosis equipment 100. The ROM 61 stores the diagnosis program for the engine control unit (ECU) 2 of a specific automobile and design data. The diagnosis equipment 100 is initialized and the design data stored in the ROM 61 is transferred to the FPGA 45. The FPGA 45 is reprogrammed with the design data to be applicable to the diagnosis program and communications protocol for the ECU 2 of the automobile 200. Communication between the ECU 2 and FPGA 45 is thus made possible.

Figure 4:
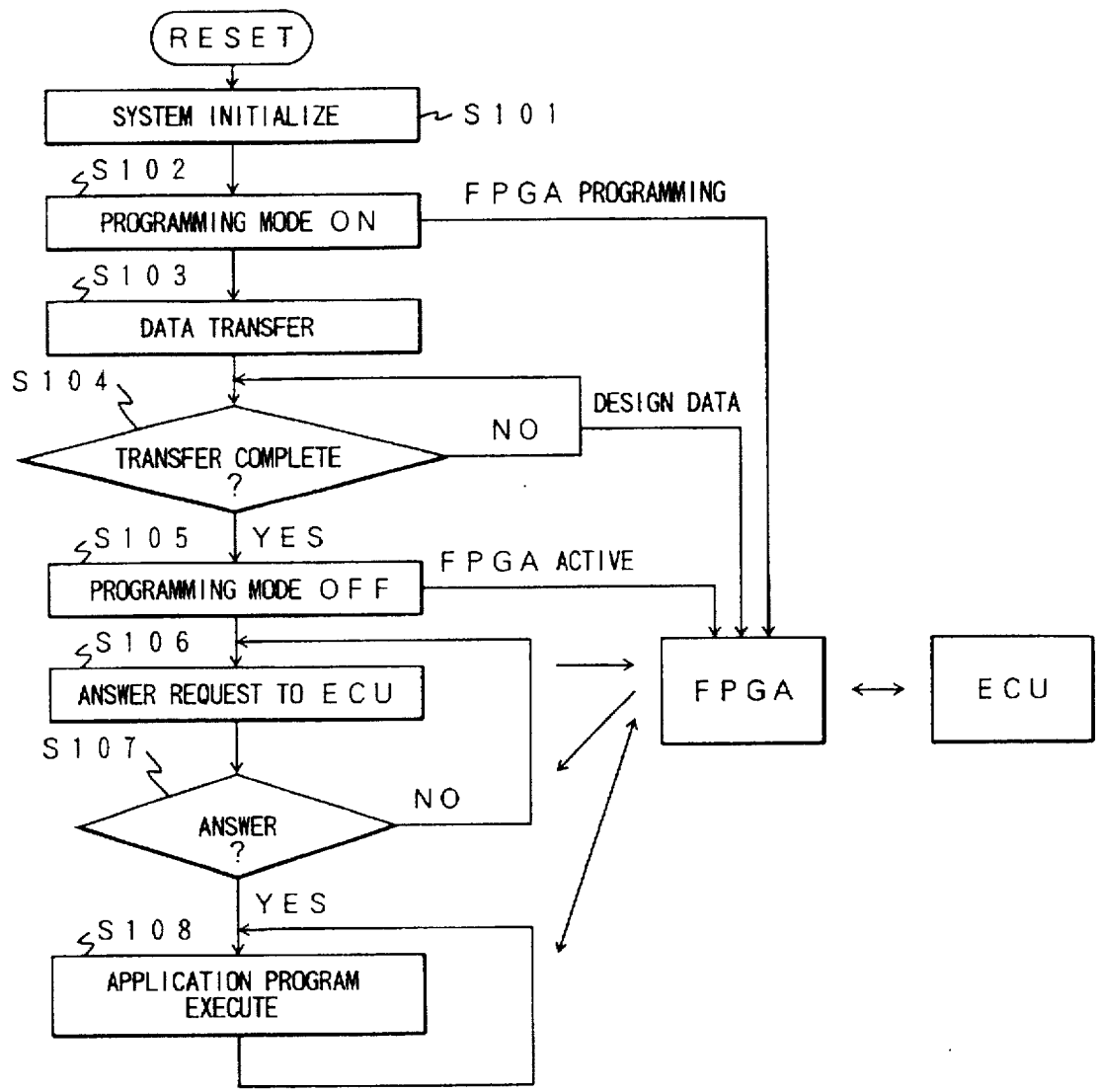
FIG. 4 is a flowchart explaining the process of data communication and diagnosis process in the first embodiment.

The flowchart shown in FIG. 4 will describe the process of the diagnosis operation with the diagnosis equipment 100.

To execute the process: first, connect the diagnosis equipment 100 with the memory cartridge 60 to the ECU 2 via adapter harness 34; and next, turn on the power switch 35 to reset the CPU 40 that governs the entire system of the diagnosis equipment 100. The entire system is thus initialized (STEP S101).

The initialization turns on the programming mode of the FPGA 45 in STEP S102. In the case where the memory 46 (FIG. 3) of the FPGA 45 is an EEPROM, its data must be erased beforehand. In STEP S103, the design data for forming communications interface applicable to the communications protocol of the ECU 2 is read from the ROM 61 of the memory cartridge 60. The design data is transferred to the FPGA 45.

In STEP S104, check is made whether the transfer of all design data is completed. If not completed, the data transfer in STEP S103 is continued. If completed, the programming mode of the FPGA 45 is turned off in STEP S105.

In the FPGA 45 as shown in FIG. 3, the logical functions of the macro-cells 47 are decided by the in-system programmer 50. This decision is in accordance with the design data stored into the memory 46 in the programming mode ON. Further, the logical wiring block 48 and the I/O wiring block 49 are inter-connected with the connecting information. When the data transfer is completed, the FPG45 is formed as the communications interface applicable to the communications protocol of the ECU 2. The FPGA 45 then becomes active to make possible the communication between the CPU 40 and ECU 2 in the programming mode OFF.

In STEP S106, the FPGA 45 transmits an answer request to the ECU 2 via communications line 63b, I/O interface 62 of the memory cartridge 60, communications line 63a of the diagnosis equipment 100, and adapter harness 34. This data transmission is done under the communications protocol of the ECU 2. The FPGA 45 then awaits the answer of the ECU 2 in STEP S107.

The answer request is supplied to the ECU 2 via input interface 6. In reply to this, the ECU 2 transmits an answer to the CPU 40 via adapter harness 34, communications line 64a, I/O interface 62, communications line 64b, and FPGA 45 to the CPU 40.

When the CPU 40 receives the answer in STEP S107, the CPU 40 executes a diagnosis program in STEP S108. While the program is running, a message representing that diagnosis is ready to start is displayed on the display screen 30 and the system goes in a key entry waiting mode.

To check a battery voltage, for example, an operator enters battery voltage diagnosis mode keys, such as "F", "0", "1", and "ENT" on the keyboard 32. This diagnosis mode is interpreted by the CPU 40 that transmits a request for battery voltage data to the ECU 2 via FPGA 45.

In reply to the request, the ECU 2 searches an address corresponding to the request in the RAM 5 to read out data. This data is transmitted to the diagnosis equipment 100.

On receiving, the diagnosis equipment 100 executes data processing, such as binary-to-decimal conversion. The processed result is displayed on the display screen 30. The operator checks the battery voltage through the display and continues diagnosing other items with corresponding key entry if desired.

As described above, the diagnosis equipment according to the first embodiment can be used for different types of electronic control units. This is achieved by exchanging the memory cartridges suitable for communications protocols with different data formats, transmission and reception timings, etc. There is thus no need for preparing other diagnosis equipment with different hardware for communications protocols of electronic control units. This results in highly efficient diagnosis operations.

The design data for the FPGA 45 is not necessarily stored in the ROM 61 of the memory cartridge 60. Such data can be loaded to the FPGA 45 from an external computer with modification of the boot program of the CPU 40.

Next, the second preferred embodiment of the diagnosis system according to the present invention will be explained.

Figure 5:
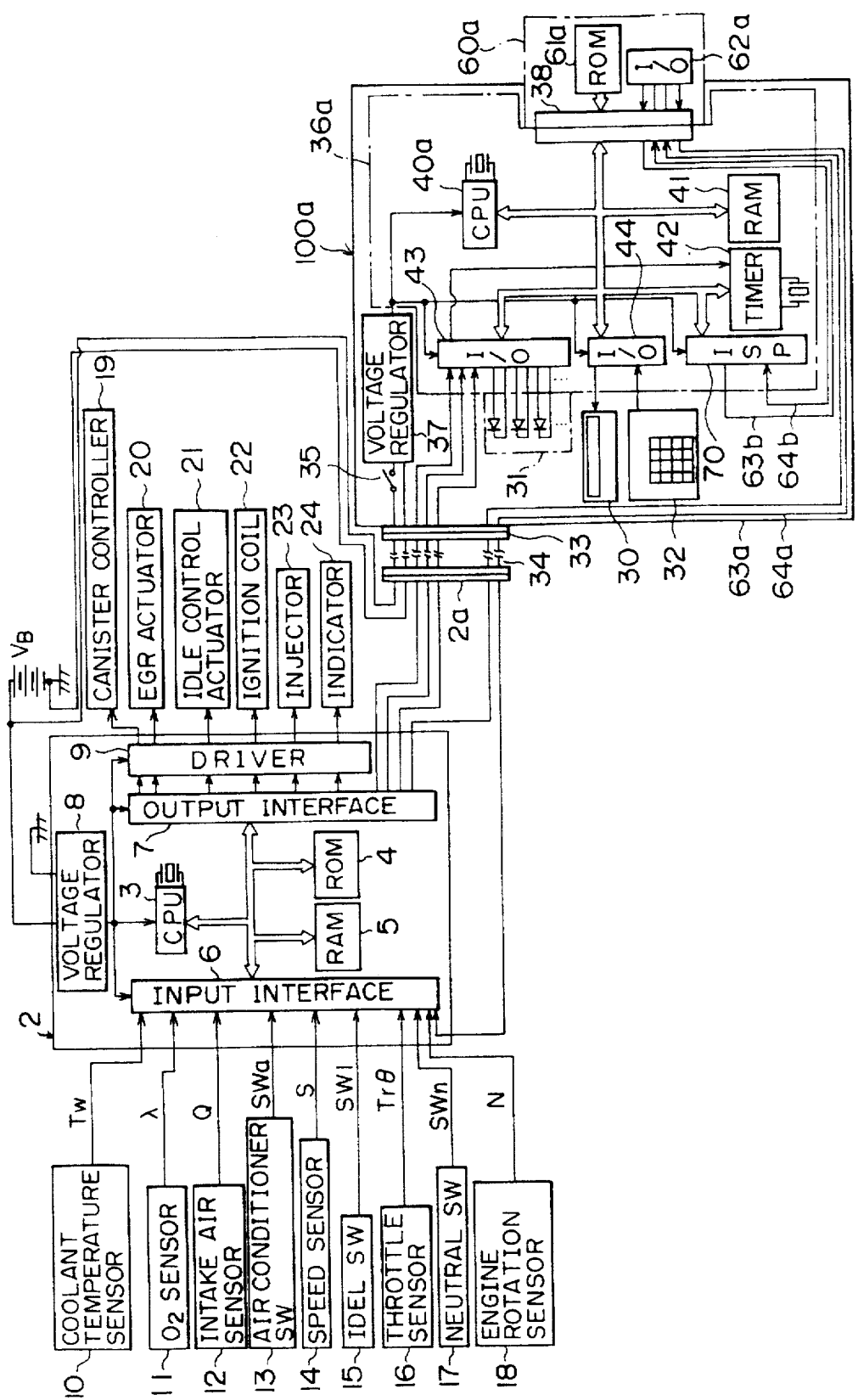
FIG. 5 shows circuit block diagrams of the electronic control unit and the fault diagnosis equipment as the second preferred embodiment according to the present invention.

As shown in FIG. 5, diagnosis equipment 100a has a controller 36a configured as a multiprocessor. The controller 36a includes a CPU 40a as a main processor, a RAM 41, a timer 42 for generating a synchronizing signal, I/O interfaces 43 and 44, and a subprocessor (ISP) 70. Via system buses, these components and a ROM 61a of a memory cartridge 60a are connected to each other. The ISP 70 sends and receives signals to and from an electronic control unit (ECU 2) in data communication via system buses in the controller 36a.

The CPU 40a is one chip processor, while the ISP 70 is one chip device including a processor, ROMs, RAMs, and I/O interfaces. However, one chip processor such as the CPU 40a and one chip device such as the ISP 70 are both defined as a processor in this invention.

The memory cartridge 60a is to make the diagnosis equipment 100a flexible for general use, or applicable to different diagnosis items, car types, communications protocols, etc. For these purposes, the ROM 61a stores several programs for the CPU 40a and ISP 70. The programs for the CPU 40a are a diagnosis boot program, a diagnosis program for the ECU 2 of a specific automobile, etc. The programs for the ISP 70 are a communications processing program adaptable to the communications protocol of the ECU 2, etc.

The memory cartridge 60a includes an I/O interface 62a that connects the ISP 70 and the ECU 2. Communications line 63a and 64a are connected to the I/O interface 62a via connector 38. Further, the communications lines 63a and 64a are connected to the input and output interfaces 6 and 7 of the ECU 2, respectively, via input/output connector 33 and adapter harness 34.

The I/O interface 62a adapts signal levels, input/output performances, etc., to the ECU 2 which are different in communications systems of automobiles and which cannot be emulated with software. Connected to the I/O interface 62a via connector 38 are communications lines 63b and 64b extended from the output and input terminals of the ISP 70, respectively. The I/O interface 62a can be replaced with wires connecting the communications lines 63a and 63b, and 64a and 64b. This replacement is possible when the signals are matched to each other between the ECU 2 and the ISP 70.

The CPU 40a has storage areas for the programs or data stored in the RAM 41 of the controller 36a and the ROM 61a of the memory cartridge 60a. The system of the diagnosis equipment 100a runs with a boot program stored in the ROM 61a. This boot program is not necessarily stored in the ROM 61a. The program can be stored in a ROM (not shown) of the controller 36a. Or, when the CPU 40a is a device having an internal ROM, the boot program can be stored in the internal ROM.

The ISP 70 makes one diagnosis equipment 100a suitable for data communication with electronic control units with different communications protocols of several types of automobiles. Thus, the ISP 70 can be said as intelligent I/O interfaces of a microcomputer. In this second embodiment, the ISP 70 is one chip device including a ROM storing the boot program, RAMs for storing data, and I/O interfaces.

To diagnose any faults, insert the memory cartridge 60a with the ROM 61a into the diagnosis equipment 100a. The ROM 61a stores the diagnosis program for the engine control unit (ECU 2) of a specific automobile and communications processing program.

The diagnosis equipment 100a is initialized and the communications processing program stored in the ROM 61a is transferred to the ISP 70. The ISP 70 executes the communications processing program to have data communication with the ECU 2. In the data communication, the ISP 70 sends the data of the CPU 40a to the ECU 2 and vice versa.

On one hand, the CPU 40a reads and writes data from and to the ISP 70 to have virtual data communication with the ECU 2. On the other hand, the ISP 70 conducts real data communication with the ECU 2 with the communications processing program sent from the ROM 61a of the memory cartridge 60a. The ISP 70 can have effective data communication with the ECU 2 independently of the diagnosis done by the CPU 40a.

The ISP 70 may have a low capacity internal memory or may be a single chip processor that does not contain such internal memory. In this case, a RAM for storing the communications processing program or working data, and a ROM for storing the boot program can be provided in the controller 36a.

Figures 6A, 6B:
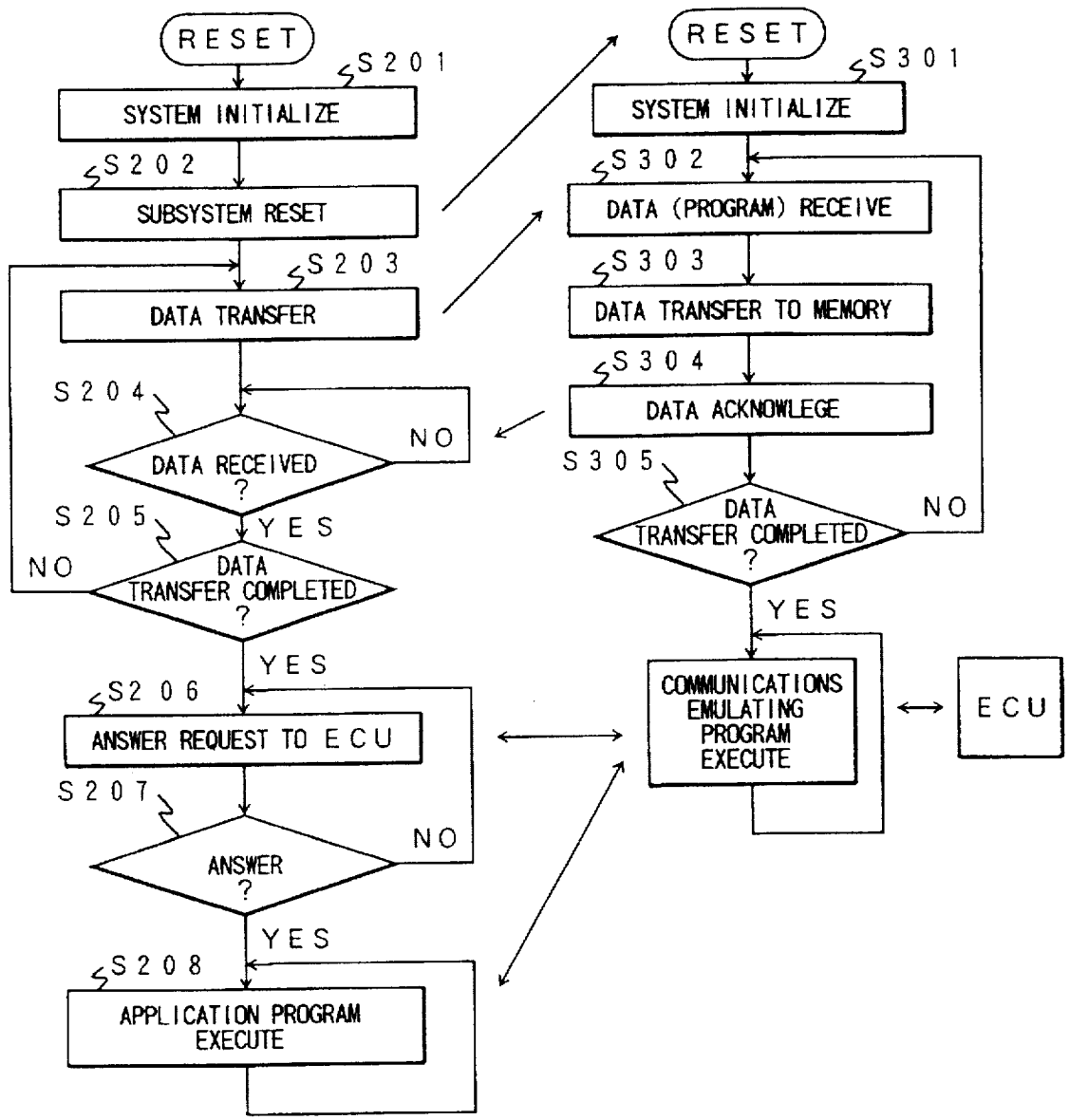
FIGS. 6A and 6B are flowcharts explaining the process of the data communication and the diagnosis process in the second embodiment.

The flowcharts shown in FIGS. 6A and 6B will describe the process of data communication and diagnosis. FIG. 6A shows the first process executed by the CPU 40a of the diagnosis equipment 100a. FIG. 6B shows the second process executed by the ISP 70 of the diagnosis equipment 100a.

To execute the first and the second process: connect the diagnosis equipment 100a with the memory cartridge 60a suitable for the ECU 2 of the automobile 200 via adapter harness 34; and turn on the power switch 35 to reset the CPU 40a that governs the main system of the diagnosis equipment 100a. Then, the first process shown in FIG. 6A starts.

In STEP S201, the main system of the diagnosis equipment 100a is initialized. Then, in STEP S202, the subsystem for data communication of the ISP 70 is reset to start the second process shown in FIG. 6B. In STEP S301 (FIG. 6B), the subsystem of the ISP 70 is also initialized.

In STEP S203, the CPU 40a reads data (communications emulating program) out of the ROM 61a of the memory cartridge 60a. The communications emulating program is used for emulating the communications protocol of the ECU 2. The data is written in a port of the ISP 70. The first process then goes in a data acknowledgement waiting loop in STEP S204.

In the second process in FIG. 6B, the ISP 70 receives the data of the emulating program loaded into its port in STEP S302. The ISP 70 transfers the data into its specific memory address (the address in the internal RAM) in STEP S303. Then, the ISP 70 sends out the data acknowledgement from its port in STEP S304.

In the first process in FIG. 6A, the CPU 40a reads the data acknowledgement in STEP S204. The first process goes to STEP S205 from the data acknowledgement waiting loop in STEP S204. Check is made in STEP S205 whether the data transfer is completed. If completed, the first process goes to STEP S206. If not completed, the first process goes back to STEP S203 to continue the data transfer.

During the STEPS S203 to S206 in the first process, the second process goes into STEP S305 from STEP S304. Check is made in STEP S305 whether the data receiving is completed. The second process goes to STEP S306 if the data receiving and data transfer to the memory of the ISP 70 are completed. If not completed, the second process goes back to STEP S302 to continue the data receiving.

In the first process, the CPU 40a writes an answer request to the ECU 2 in a port of the ISP 70 in STEP S206. This is done after the completion of the transfer of the communications emulating program from the CPU 40a to ISP 70. The CPU 40a then goes in an answer waiting mode for waiting an answer from the ECU 2 in STEP S207.

At the same time, the ISP 70 executes the communications emulating program in STEP S306 in the second process. The ISP 70 reads the answer request from the CPU 40a and sends out answer request data at its output terminal. The request data is transferred to the ECU 2 via communications line 63b, I/O interface 62a of the memory cartridge 60a, communications line 63a, and adapter harness 34. This request data transfer is made under the communications protocol of the CPU 2.

The ECU 2 reads the request data through the input interface 6. The ECU 2 then sends out reply data through the input interface 7. The reply data is transferred to the ISP 70 at its input terminal via adapter harness 34 communications line 64a, I/O interface 62a of the memory cartridge 60a, and communications line 64b. Further, the reply data is sent out to the system buses from a port of the ISP 70.

In the first process, the CPU 40a reads the reply data from the ISP 70 and acknowledges the reply of the ECU 2 in STEP S207. The first process then goes to STEP S208 in which an application program on the diagnosis is executed. The message "diagnosis start OK" is displayed on the display screen 30 and the first process goes in a waiting mode for waiting key entry on the keyboard 32 while the application program is running.

To check a battery voltage, for example, an operator enters battery voltage diagnosis mode keys, such as "F", "0", "1", and "ENT" on the keyboard 32. This diagnosis mode is interpreted by the CPU 40a that transmits a request for battery voltage data to the ISP 70.

The ISP 70 converts the battery voltage data request data into a data transfer request signal in a specific format and timing under the communications protocol of the ECU 2. On receiving, the ISP 70 receives battery voltage data sent from the ECU 2 and sends out the data at its port.

The CPU 40a reads the data sent from the ISP 70 and executes data processing, such as binary-to-decimal conversion. The processed result is displayed on the display screen 30. The operator checks the battery voltage through the display and continues diagnosing other items with corresponding key entry if desired.

As described above, the diagnosis equipment according to the second embodiment can be used for different types of electronic control units. This is achieved by exchanging the memory cartridges suitable for communications protocols with different data formats, transmission and reception timings, etc. There is thus no need to prepare other diagnosis equipment with different hardware for communications protocols of electronic control units. This results in highly efficient diagnosis operations.

The second embodiment employs the ISP 70 as one chip subprocessor including ROM, RAM, and I/O interfaces. However, one chip processor with a data processing unit only can be used as the ISP 70. In this case, ROM or RAM with storage area for the ISP 70 are provided in the controller 36a. And, a portion of the ROM or RAM or a portion of the RAM 41 for the CPU 40a is used as a communications buffer. This communications buffer can be used for both transfer of the communications processing program stored in the ROM 61a of the memory cartridge 60a and data communication between the CPU 40a and ISP 70.

The controller 36a may be equipped with a direct memory access (DMA) controller. In this case, the communications processing program can be transferred by DMA transfer from the ROM 61 to the ISP 70.

Further, the communications processing program for the ISP 70 is not necessarily stored in the ROM 61a of the memory cartridge 60a. Another way is that the boot program for the CPU 40a is modified to be loaded with the communications processing program from an external computer.

According to the description above, the present invention has the following advantages:

The fault diagnosing equipment is equipped with an integrated circuit the logical functions of which is reprogramable on board with design data. The integrated circuit is employed as the communications interface suitable for the communications protocol of an electronic control unit installed in an automobile. The diagnosis equipment executes diagnosis with data sent from the electronic control unit in the data communication under the communications protocol. The diagnosis equipment according to the present invention thus can be used for several types of electronic control units with different communications protocols. This makes the diagnosis equipment flexible for general use and decreases cost for diagnosis.

Further, the design data for the integrated circuit that forms the communications interface is stored in a recording medium in a detachable cartridge. The diagnosis equipment is thus made suitable for different communications protocols of several electronic control units installed in automobiles. The diagnosis program is also stored in the same recording medium in the detachable cartridge. Hence, the program is easily converted into a diagnosis program suitable for an electronic control units on an automobile. This results in high diagnosis operability.

Further, the integrated circuit that forms the communications interface is connected to an electronic control units on an automobile via interface circuit in the cartridge. With this interface circuit, signal levels, input/output performances, etc., which are different in communications systems of automobiles and which cannot be compensated for with adaptation of the communications protocol can be made suitable for any electronic control unit.

Further, the present invention has the following advantages:

The communications processing program is externally convertible into the one suitable for the communications protocol of an electronic control unit installed in an automobile. The subprocessor executes the communications processing program to have data communication with the electronic control unit. And, the main processor for diagnosis exchanges data with the subprocessor. This means that the main processor has virtual data communication with the electronic control unit. The diagnosis equipment thus can be used without changing its hardware for several types of electronic control units with different communications protocols. This makes the diagnosis equipment flexible for general use and decreases cost for diagnosis.

Further, the communications processing program for the subprocessor is stored in a recording medium in a cartridge. This makes the stored program convertible to the communications processing program suitable for the communications protocol of an electronic control unit installed in an automobile. The diagnosis program for the main processor is also stored in the same recording medium in the cartridge. This also makes the stored program convertible to the diagnosis program suitable for the communications protocol of an electronic control unit on an automobile. Further, installation of the programs in the same recording medium results in high diagnosis operability.

Further, execution of the diagnosis program by the main processor and the communications processing program by the subprocessor are conducted with their own storage areas. The diagnosis processing and communications processing are thus executed independently of each other. This results in high processing capability.

Further, the subprocessor is connected to an electronic control unit installed in an automobile via interface circuit in the cartridge. With this interface circuit, signal levels, input/output performances, etc., which are different in communications systems of automobiles and which cannot be compensated for with adaptation of the communications protocol can be made suitable for any electronic control units.

While the presently preferred embodiments of the present invention have been shown and described, it is to be understood these disclosures are for the purpose of illustration and that various changes and modifications may be made without departing from the scope of the invention as set forth in the appended claims.

What is claimed is:

1. A diagnosis device removably connectable to an electronic control unit installed in a motor vehicle for data communication, the electronic control unit having a communication protocol, the diagnosis device comprising:

a main processor provided for issuing a command directed to the electronic control unit and processing data transmitted from the electronic control unit in response to the command; and a field programmable gate array provided between the main processor and the electronic control unit, the field programmable gate array being reprogrammable so as to make communication between the main processor and the electronic control unit possible under the communication protocol of the electronic control unit, wherein the field programmable gate array is a communication interface with logical functions being reprogrammable on board by transmitted design data to make the communication interface applicable to the communication protocol of the electronic control unit, thereby enabling the diagnosis device to diagnose electronic control units having different communication protocols.

2. The diagnosis device according to claim 1, wherein:

the field programmable gate array includes either a volatile or a nonvolatile storage means for storing the transmitted design data.

3. The diagnosis device according to claim 2, further comprising:

a memory disposed in a detachable cartridge and operatively connected to the main processor, the memory including design data, wherein the main processor reprograms the communication interface in accordance with the design data read out from the memory in the cartridge when the diagnosis device is activated.

4. The diagnosis device according to claim 1, further comprising:

a memory disposed in a detachable cartridge and operatively connected to the main processor, the memory including design data, wherein the main processor reprograms the communication interface in accordance with the design data read out from the memory in the cartridge when the diagnosis device is activated.

5. A diagnosis device removably connectable to an electronic control unit installed in a motor vehicle for data communication, the electronic control unit having a communication protocol, the diagnosis device comprising:

a main processor provided for issuing a command directed to the electronic control unit and processing data transmitted from the electronic control unit in response to the command; and a sub-processor provided between the main processor and the electronic control unit, the sub-processor being reprogramable so as to make communication between the main processor and the electronic control unit possible under the communication protocol of the electronic control unit, wherein the sub-processor has a communication processing program being reprogrammable on board so as to emulate the main processor and the electronic control unit, thereby enabling the diagnosis device to diagnose electronic control units having different communication protocols.

6. The diagnosis device according to claim 5, further comprising:

a memory disposed in a detachable cartridge and operatively connected to the main processor, the memory including data of the communication processing program to make the sub-processor applicable to the communication protocol of the electronic control unit, wherein the main processor transfers the data of the communication processing program from the memory in the cartridge to a memory for the sub-processor when the diagnosis device is activated.

7. The diagnosis device according to claim 6, wherein:

the memory for the sub-processor is allocated in a storage area of the main processor.

8. A diagnosis method, comprising:

connecting a diagnostic device to an electronic control unit installed in a motor vehicle for data communication, the electronic control unit having a communication protocol, the diagnostic device comprising a main processor provided for issuing a command directed to the electronic control unit and processing data transmitted from the electronic control unit in response to the command; and a field programmable gate array provided between the main processor and the electronic control unit, the field programmable gate array being reprogrammable so as to make communication between the main processor and the electronic control unit possible under the communication protocol of the electronic control unit, wherein the field programmable gate array is a communication interface with logical functions being reprogrammable on board by transmitted design data to make the communication interface applicable to the communication protocol of the electronic control unit, thereby enabling the diagnosis device to diagnose electronic control units having different communication protocols; and initiating communication of data between the electronic control unit and the diagnostic device.

* * * * *